US006940289B2

(12) United States Patent
Hyacinthe et al.

(10) Patent No.: US 6,940,289 B2
(45) Date of Patent: Sep. 6, 2005

(54) METHOD AND APPARATUS FOR TRACING A LINE

(75) Inventors: John Wesley Hyacinthe, Plantation, FL (US); Charles Raymond Shambaugh, Jr., Coral Gables, FL (US)

(73) Assignee: Advanced Test Products, Inc., Miramar, FL (US)

(*) Notice: Subject to any disclaimer, the term of this patent is extended or adjusted under 35 U.S.C. 154(b) by 84 days.

(21) Appl. No.: 10/453,666

(22) Filed: Jun. 4, 2003

(65) Prior Publication Data

US 2004/0245998 A1 Dec. 9, 2004

(51) Int. Cl.[7] .......................... G01R 31/11; G01R 19/00

(52) U.S. Cl. ......................................... 324/534; 324/67

(58) Field of Search ................................ 324/534, 512, 324/500, 66, 67, 509, 522, 543, 326, 713; 361/42; 340/635, 856.3

(56) References Cited

U.S. PATENT DOCUMENTS

| | | | | |
|---|---|---|---|---|
| 4,613,848 A | | 9/1986 | Watkins | 340/541 |
| 4,751,498 A | | 6/1988 | Shalvi et al. | 340/524 |
| 4,829,151 A | | 5/1989 | Buchler | 219/69.12 |
| 5,101,161 A | * | 3/1992 | Walsh et al. | 324/543 |
| 5,300,068 A | * | 4/1994 | Rosar et al. | 606/34 |
| 5,352,984 A | * | 10/1994 | Piesinger | 324/532 |
| 5,444,364 A | * | 8/1995 | Satterwhite et al. | 324/67 |
| 5,818,315 A | * | 10/1998 | Moongilan | 333/238 |
| 6,002,260 A | * | 12/1999 | Lau et al. | 324/522 |
| 6,026,145 A | * | 2/2000 | Bauer et al. | 379/22.03 |
| 6,084,207 A | | 7/2000 | Jones | 219/213 |
| 6,166,532 A | * | 12/2000 | Coia et al. | 324/67 |
| 6,184,485 B1 | | 2/2001 | Day et al. | 219/69.12 |
| 6,344,748 B1 | * | 2/2002 | Gannon | 324/542 |
| 6,525,665 B1 | * | 2/2003 | Luebke et al. | 340/635 |
| 6,683,459 B2 | * | 1/2004 | Dindis et al. | 324/534 |
| 2004/0015311 A1 | * | 1/2004 | Furse et al. | 702/108 |
| 2004/0113633 A1 | * | 6/2004 | Kim et al. | 324/642 |

* cited by examiner

*Primary Examiner*—Anjan Deb
*Assistant Examiner*—Hoai-An D. Nguyen
(74) *Attorney, Agent, or Firm*—Baker & Hostetler LLP

(57) ABSTRACT

A method and apparatus includes a signal generator, a power supply, a micro-controller a transmitter and a receiver for determining the condition of a line. The signal is passed through the line and any reflection is used to determine varying characteristics of the line.

36 Claims, 10 Drawing Sheets

METHOD AND APPARATUS FOR TRACING A LINE

FIELD OF THE INVENTION

The present invention relates generally to test instruments. More particularly, the present invention relates to the ability to determine the condition of a energized or non-energized line.

BACKGROUND OF THE INVENTION

A wire tracer is an instruments that is capable of tracing wires, locating circuit breakers, finding faults and open-circuited and short-circuited wires. Wires are usually enclosed within a structure. It is difficult at time to tell their position. A number of electrical conductors are frequently routed through structures which hide the conductors from view and from accessibility. For example, a business has telephone, data and electrical wiring generally located behind the wall. The reason behind locating the wall within the structure is both aesthetic and safety. For the former, the buried line does not disrupt or deter from the appearance of business. For the latter, the interaction that could occur between the wiring and the employees is minimized.

Similarly, in industrial installations, electrical wiring is frequently bundled and positioned in such a way that there is as minimal contact with the wiring as possible. Industrial lines usually carry a significant amount more voltage than found in either homes or small businesses. Burying the cable within the structure substantially decreases the potential of any contact with the lines.

In such installations, individual conductors can, therefore, be difficult to test. This is because the technician cannot readily see the conductor. Without going into the actual wall, the location and path of the conductor can be very difficult to assess and repair. The conductor can also be difficult to test because a specific conductor is difficult to isolate in a large number of conductors due the similarity of appearance between all the conductors. In these situations, the route of a specific conductor cannot be readily ascertained by visual tracing.

As a result of the difficulty of tracing or isolating wires in walls or other conduits, or in a large bundle of similar wires, line or wire tracing devices have arisen as one possible solution in tracing embedded wires. Wire tracing devices generally include a transmitter for transmitting an electromagnetic signal along a wire to be analyzed. A receiver for wirelessly detecting the signal is positioned at another location along the length of the wire.

The electromagnetic signal is preferably a distinct modulated signal. The receiver acts as an antenna, receiving and supplying an indication of the captured signal.

There are many different existing types of wire tracers currently in existence. Previous models were produced only with a transmitter and a receiver. The transmitter generated a 17 kHz signal and the receiver is tuned to pick up the 17 kHZ signal. This specific model could only detect an energized circuit up to 300 volts and non-energized circuits. The problem with this model is that the transmitted signal is usually only able to be detected no more than three feet away from the transmitter.

In other equipment, the models can only trace energized lines at lower levels or only non-energized lines. These models cannot detect a combination of both an energized line and a nonenergized line.

These previous devices were designed for professionals with deep knowledge in electronics and communication. The testing procedures can be a challenge for an less experienced technician. This is evidenced by the number of technical calls received by vendors of these devices.

Another problem with the current devices are their reliability. The devices on the market today are less then ninety-percent reliable. This is a fairly high rate of error in this particular field which can result in higher repair costs.

Accordingly, it is desirable to provide a method and apparatus that is able to permit that user to use a single device to determine whether the line is energized, the voltage and the condition. It is further desired to have a device with a low margin of error and is able to detect a reflected signal from an acceptable distance away from the generation of reflected signal.

SUMMARY OF THE INVENTION

The foregoing needs are met, to a great extent, by the present invention, wherein in one aspect an apparatus is provided that in some embodiments the line to be tested can be analyzed to determine whether the line is energized, its impedance, its voltage and the condition of the line without a wide array of test instruments.

In accordance with one embodiment of the present invention, an apparatus for tracing a line includes a transmitter, a signal generator, which produces a signal that is transmitted along the line by he transmitter, a micro-controller linked to the transmitter and the signal generator, the micro-controller determines whether the line is energized, the impedance of the line, the voltage and the condition of the line, a receiver linked to micro-controller, wherein the receiver captures a reflected signal of the transmitted signal and an output linked to the micro-controller. The present embodiment can also include an internal or external power supply.

As a safety precaution, the line is analyzed to determine if it is energized. If upon using the present invention, it is determined that the line is energized, then a ground fault circuit is activated by the micro-controller. The range of voltage that the present invention can determine is 9 to 600 volts.

In the preferred embodiment, the condition of the line is determined by the micro-controller analyzing a reflected signal of the transmitted signal. The transmitted signal and the reflected signal are analyzed and the voltage wave standing ratio is computed.

If a short wire condition is detected, the reflected signal is inverted. If an open wire is detected, the reflected signal is not inverted. If a terminated line is detected, little if any reflected signal is detected.

In the preferred embodiment, in order to create a reflected signal, a impedance mismatch must be created. If a mismatch is not created, the signal is allowed to progress through the line without little if any reflection.

In accordance with another embodiment of the present invention, a method for tracing a line includes the steps of determining if the line is energized, if the line is energized, activating a ground fault, creating an impedance mismatch in the line, transmitting a signal through the line, if there is a reflected signal, capturing the reflected signal, analyzing the reflected signal and determining the condition of the line. This alternate embodiment can also include the steps of determining the voltage of the line, which can be in the range of 9 volts to 600 volts.

To create a reflected signal, an impedance is created in the line. The strength of the signal is accomplished by adjusting the impedance of the circuit. Analyzing the reflected signal determines the current condition of the line. An inverted signal is an indication of a short wire condition. A non-inverted reflected signal is an indication of an open wire. Little, if any reflection, is an indication of a terminated wire. In some instance, the reflected signal is amplified and filtered.

In accordance with yet another embodiment of the present invention, an apparatus for tracing a line includes means for determining if the line is energized, if the line is energized, activating a ground fault, means for creating an impedance mismatch in the line, means for transmitting a signal through the line, if there is a reflected signal, means for capturing the reflected signal, means for analyzing the reflected signal and means for determining the condition of the line. This apparatus can further include means for determining the voltage of the line, which can be in the range of 9 volts to 600 volts.

In this embodiment, an impedance mismatch creates the reflected signal. The impedance is adjusted by analyzing the strength of the signal.

The condition of the line is determined by determining the voltage wave standing ratio. A short wire condition is determined by receiving a reflected signal that is an inversion of the transmitted signal. An open wire condition is determined by the reflected signal is that is not an inversion of the transmitted signal.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

Figure 1:
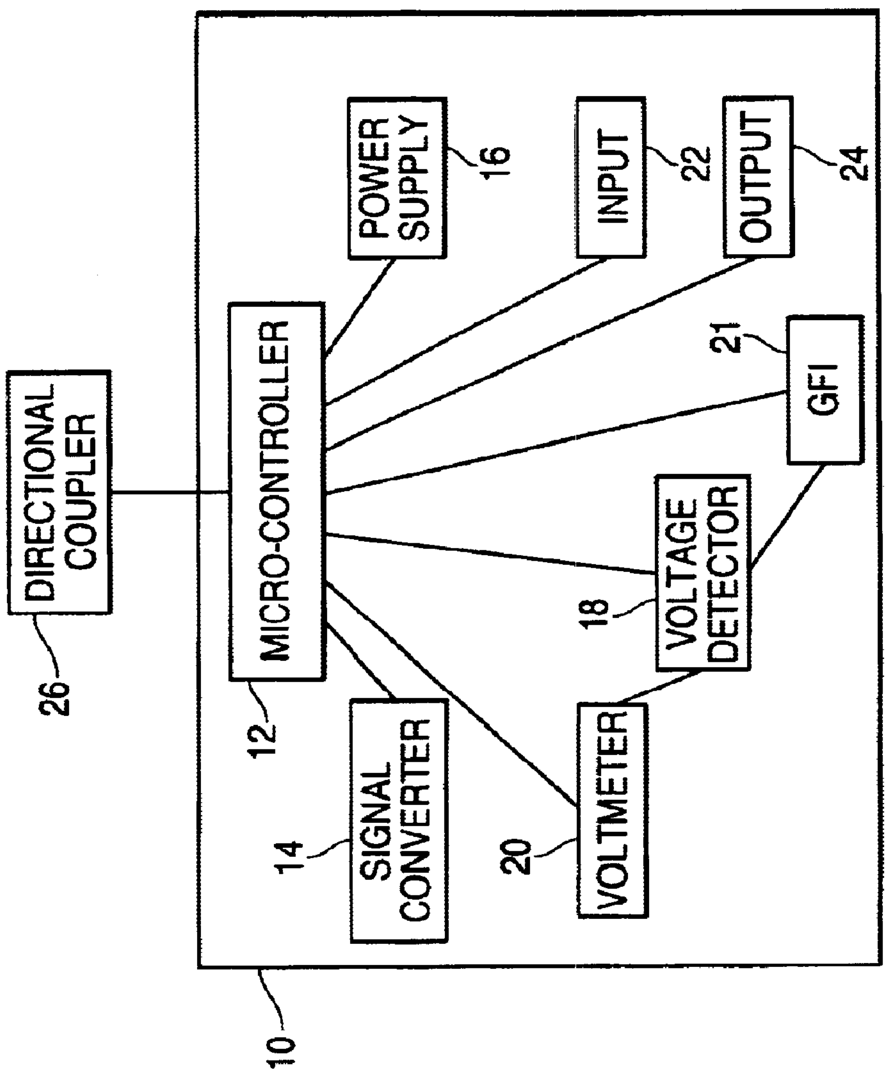
FIG. 1 is a block diagram illustrating a preferred embodiment of the invention.

The invention will now be described with reference to the drawing figures, in which like reference numerals refer to like parts throughout. An embodiment in accordance with the present invention provides a method and apparatus that is used to detect the condition of a wire that is embedded in a structure. With the present inventive method and apparatus, a field technician is able to determine the current electrical condition of the line such as an open and short circuited wire. The present inventive method and apparatus also enables the field technician the ability to detect whether the line is energized and the respective voltage.

A field technician is able to use the present inventive method and apparatus to determine the location of the any fault condition detected in the line. A reflect signal can be detected with a receiver without having to position in a specific manner in order for it to be connected.

An embodiment of the present inventive apparatus is illustrated in FIG. 1. Contained within a housing 10 are a number of individual components that enable the present invention to operate. At the center of the present invention is a micro-controller 12. Linked to the micro-controller 12 is a signal generator 14. In the preferred embodiment, the signal generator 14 is a 32.768 kHz crystal oscillator, fourteen stage counter, duty cycle controller, date drivers, 2:3 pot core transformer and a temperature compensator.

A power supply 16 is linked to the micro-controller 12. The power supply 16 has an adjustable power range of twenty-four, eighteen and nine volts. The power supply is adjusted based upon the needs and use of the present invention.

Attached to the micro-controller 12 is a voltage detector circuit 18, which is determines whether the line being traced is energized or not. If it is determined that the line is energized, a voltmeter 20 is connected to the voltage detector circuit 18 and micro-controller 12. The voltmeter 12 measures the voltage of the traced line. Additionally, because a line voltage has been detected, a ground fault circuit 21 is activated. The ground fault circuit 21 is linked or connected to the micro-controller 12. In essence, the micro-controller 12 is a switch that activates the ground fault circuit in the instance an energized line is detected.

In using the present invention, the apparatus in FIG. 1 includes an input device 22. The input device 22, in preferred embodiment, activates the present invention. Alternate embodiments of the present invention can include alternate functions such as programming the device to operate in a number of different modes such as open circuit and closed circuit. The input device 22 can also be used to alternate between various measurement types such as English and metric.

Linked to the micro-controller 12 is an output device 24 to aid the technician. The output device 24 provides data that has been collected and analyzed by the micro-controller 12. In the preferred embodiment, the output device 24 includes or comprises a number of different devices. A liquid crystal display (LCD) is used to provide data concerning the line being analyzed. Type of data being provided to the technician includes voltage measurements and the distance along the traced line that a fault has occurred.

The preferred embodiment also includes an audio output device, which alters the audio output so that a technician is able to determine the condition of the line has been determined. The condition of the line is a terminated, short or open wire. In other words, the audio output is adjusted to provide notification of a specific event. This event can be the reception of a reflected signal or the presence of a fault in the line.

A directional coupler 26 is attached to both the micro-controller 12 and the signal generator 14. The directional coupler 26 transmits the signal produced by the signal generator 14. The directional coupler 26 also samples the signal that is being transmitted as well as any signal that is reflected back through the line that is being traced. In the preferred embodiment, the directional coupler is provided by Mini-Circuits® of Brooklyn, N.Y., product number PDC-15-6.

Figure 2:
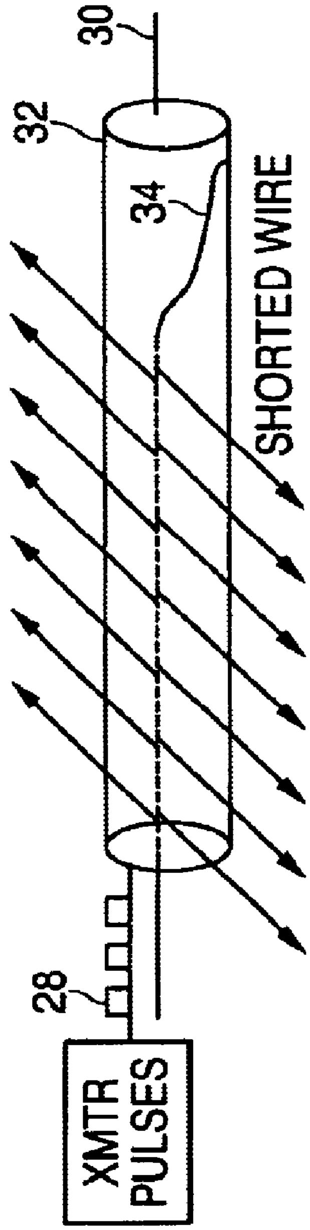
FIG. 2 is an illustration of the preferred embodiment transmitting a signal transmitted through a traced line that contains a short circuit.

FIG. 2 is an illustration of a signal transmitted through a traced line that contains a short circuit. Transmitting a signal through a line and analyzing its reflection is known as time domain reflectometer (TDR). In the present invention, the signal generator 14 produces a signal 28 that is transmitted by the directional coupler 26 through the conductor 30 of the line 32. As the transmitted energy pulse from a source travels down the cable, all of the pulse energy is absorbed if the cable is properly terminated and the cable has a constant impedance. If the pulse reaches an impedance discontinuity, part or all of the pulse energy is reflected back to the transmitting source.

As the signal 28 reaches a short 34, an impedance is encountered. As a result of the mismatch in impedance, the signal 28 is reflected back. The reflected signal is detected by the directional coupler 26. Upon receiving or capturing the reflected signal, the phase relationship between the signal 28 and the reflected signal is used to determine the type of fault causing the reflection. Reflections from an impedance higher than the characteristic impedance of the cable are in phase. Reflections from a lower impedance are out of phase. A short wire, such as in FIG. 2, results in a lower impedance and therefore a reflected signal that is out of phase. A receiver measures the time between the transmitted signal and reflected pulse to determine the distance of the discontinuity.

Figure 3:
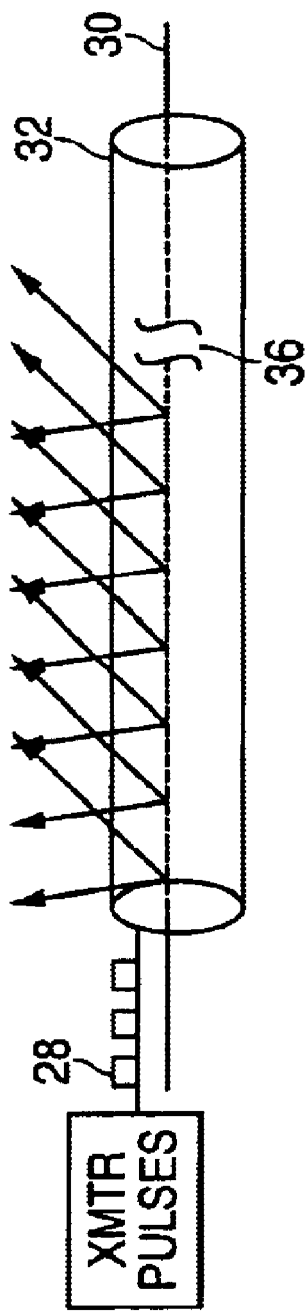
FIG. 3 is an illustration of the preferred embodiment transmitting a signal transmitted through a traced line that contains a open circuit.

FIG. 3 is an illustration of the preferred embodiment transmitting a signal transmitted through a traced line that contains a open circuit. In this figure, a signal or pulse 28 is transmitted through the conductor 30 of the wire 32. Similar to the short in FIG. 2, the signal passes through the conductor 30 until it encounters the break or open circuit 36 in the wire 32. At the point the signal encounters the open circuit 34, a mismatch in impedance is encountered by the signal. As a result of this mismatch in impedance, the signal is reflected back towards the signal generator 14 or the transmission source. Unlike the short 34 in FIG. 4, the signal is reflected in phase with the transmitted signal 28. This is because reflections from an impedance higher than the characteristic impedance of the cable are reflected in phase.

Figure 4:
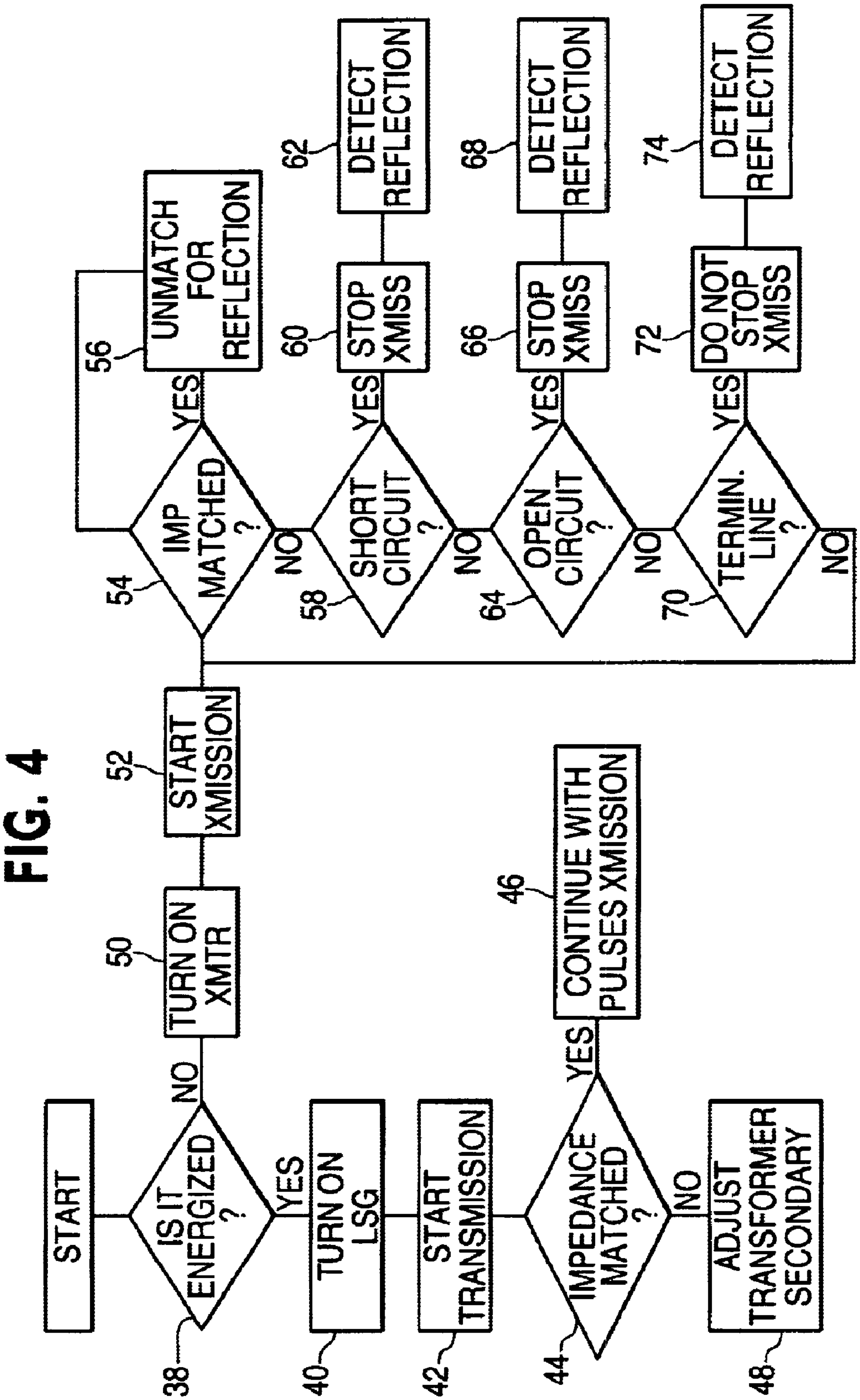
FIG. 4 is a flowchart illustrating the steps of the preferred embodiment of the present invention.

FIG. 4 is a flowchart illustrating steps that may be followed in accordance with one embodiment of the method or process. This figure illustrates tracing a terminated line. When transmitting a signal on a terminate line, the reflected signal is very low. As the transmitted signal 28 pulse travels down the conductor 30 in the line 32, all of the signal's energy is absorbed because the cable has a constant character impedance.

FIG. 4 is a flowchart illustrating the steps of the preferred embodiment of the present invention. This figure details the process that the present invention uses to assess a line being traced by a field technician. After powering up the device, the preferred embodiment determines whether the wire 32 being traced is energized 38 or not. This is accomplished with the voltage detector circuit 18. It is important to note that an energized line permits a transmitted signal to transmit up to two miles in length. If the line 32 is not energized, a power booster is attached to boost the signal to achieve a two mile traceable signal.

If the line 32 is energized 38, then the present invention activates 40 the ground fault circuit 21. The ground fault circuit 21 adds a safety measure to the preferred embodiment. It ensures that the field technician is not electrocuted with the energized line.

Once the ground fault circuit 21 is activated, the signal generator 13 begins to transmit 42 a signal 28 through the conductor 30 of the line 32. Through the step 44 of matching the impedance, the present invention determines if the impedance in the line is matched. If the impedance is matched, then the signal generator 14 continues with the step of transmitting 46 the signal 28 through the line 32. If the system does not match the impedance in the line 32, then the present invention through the step of adjusting 48 alters the impedance until it is matched.

Once the present invention is activated, the micro-controller 12 completes the step 44 of matching the impedance. In the case of a terminated line, the reflected signal is very low compared to the transmitted signal. Therefore, little, if any reading is registered and the step 44 is matching the impedance is continued. When the system encounters the closest match in impedance, the step 44 of matching the impedance is stopped and the step 46 of transmitting the signal 28 is continued.

If the line is not energized 38, then the ground fault circuit 21 is bypassed and the signal generator 14 is activated 50 and a signal is transmitted 52 or passed through the conductor 30 of the line 32. Through the step 54 of determining matching impedances, the present invention determines if character impedance is matched. If there is a match, then through the step 56 of unmatching, the present invention alters the impedance such that there is a mismatch. This is done to create a reflected signal. Each time the device alters the impedance, the present invention transmits another signal to determine through the step 54 of matching impedance whether a reflected signal is present or not.

If through the step 54 of determine matching impedances, it is determined that there is a mismatch, the device then determines the condition of line. In the preferred embodiment, the impedance mismatch creates a reflected signal. The reflected signal determines whether the line is short circuited, open circuited or a terminated line.

After the impedance mismatch has been determined, the device then proceeds to determine through the step 58 of a short circuit whether the line contains a short. If the line does contain a short, then the signal generator 14 through the step of ceasing 60 prevents the signal generator 14 from transmitting any more signals. The directional coupler 26 through the step detecting 62 captures the reflected signal and transmits it to the micro-controller 12 to be analyzed.

If the line 32 does not contain a short circuit, then the device determines through the step 64 of the open circuit whether the line 32 contains an open circuit. If the line 32 does contain a open circuit, then the signal generator 14 through the step 66 of stopping prevents the signal generator 14 from transmitting any more signals. The directional coupler 26 through the step detecting 68 captures the reflected signal and transmits it to the micro-controller 12 to be analyzed.

If the line 32 does not contain an open circuit, then the device determines through the step of a terminating line 70 whether the line 32 is terminated. If the line 32 is terminated, then the signal generator 14 through the step of continuing 72 keeps the signal generator 14 transmitting signals through the line 32. During this transmission period through the step 74 of detecting, the directional coupler captures any deflection. If the line is not terminated, the process begins all over again at the step 54 of determining whether there is an impedance match or not.

Figure 5:
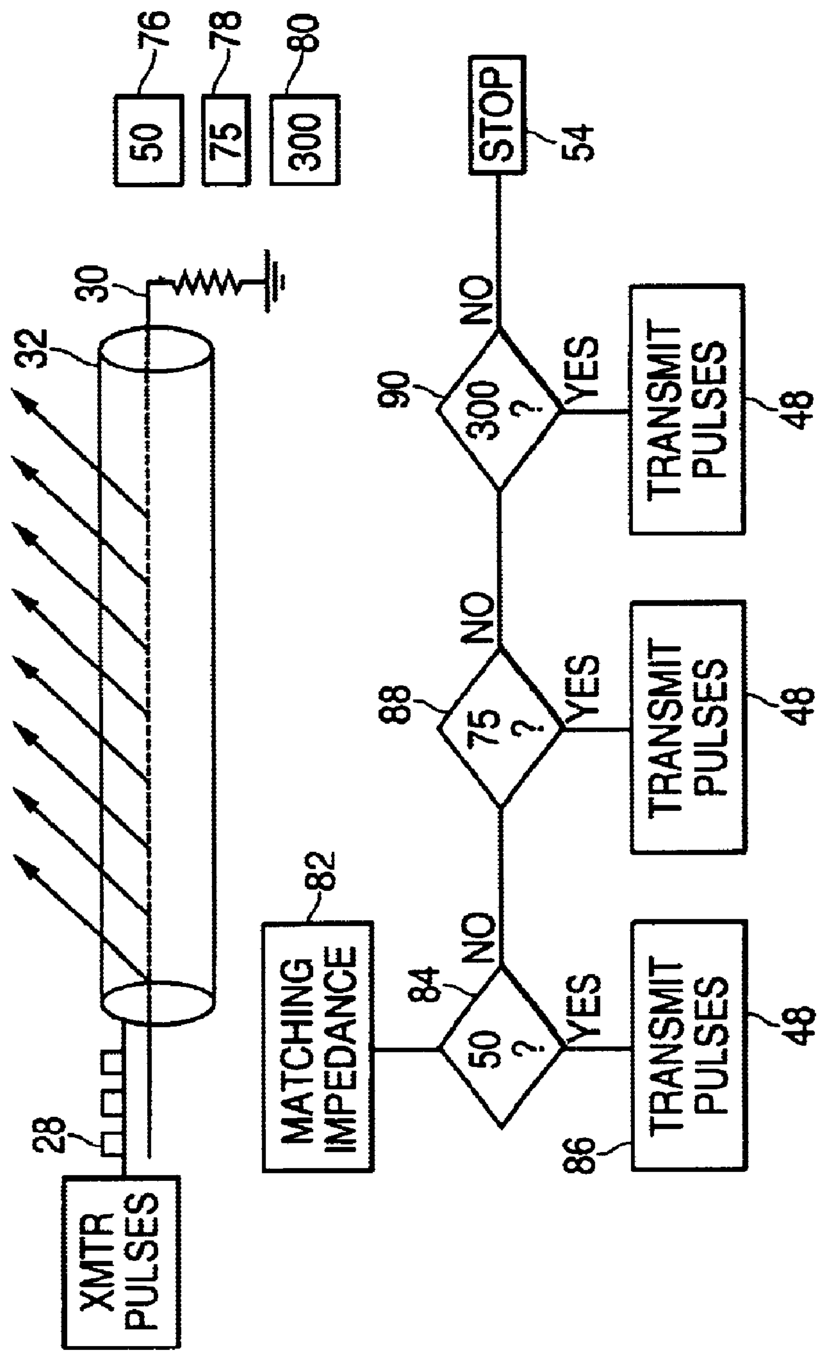
FIG. 5 is a flowchart illustrating steps that may be followed in accordance with one embodiment of the method or process of tracing a terminated line.

FIG. 5 illustrates a terminated line. The terminated line transmits a signal 28 through the conductor 30 of a wire. At the opposing ending of the signal generator 14 is an impedance, which can be fifty 76, seventy-five 78 or a three-hundred ohm 80 impedance. Alternate embodiments embodiments of the present invention entail the present invention matching any number of impedances encountered on a line. The characteristic impedances fifty 76, seventy 78 and three-hundred ohms 80 are the most common transmission lines.

In the preferred embodiment, once activated, the signal generator 14 through the control of the micro-controller 12 begins to transmit a signal 28 through conductor 30 of the wire 32. If the line is a terminated line, the reflected signal will be very low. Each time a reflected signal is captured by the directional coupler 26, a comparison is completed of the transmitted signal to the reflected signal and therefore gives a range outside of the plus or minus five percent. The micro-controller 12 resets the reading on the output device 24 to zero and continues to transmit the signal. Each time a signal 28 is transmitted, the system alters impedance in order to obtain a better reflected signal.

However, in a terminated line, the comparison of the transmitted signal to the reflected signal does not come within the plus or minus five percent error range. The preferred embodiment continues to transmit and determines that the wire 32 being traced is terminated. Once it realizes this, the system begins to match the step 82 of matching the impedance in the wire 32. The micro-controller 12 determines if the impedance of the line is fifty ohms 84. If it is, then the preferred embodiment continues the step 86 of transmitting the signal 28 and detects any reflections of the signal 28. If the impedance of the line is not fifty ohms 84, then the present invention determines if the impedance of the line is seventy-five ohms 88. If it is, then the preferred embodiment continues the step 86 of transmitting the signal 28 and detect any reflections of the signal 28. If the impedance of the line 32 is not seventy five ohms 78, then the present invention determines if the impedance of the line is three-hundred ohms 90. If it is, then the preferred embodiment continues the step 48 of transmitting the signal 28 and detects any reflections of the signal 28. If the impedance is not three-hundred ohms 32, then the present invention stops.

Figure 6:
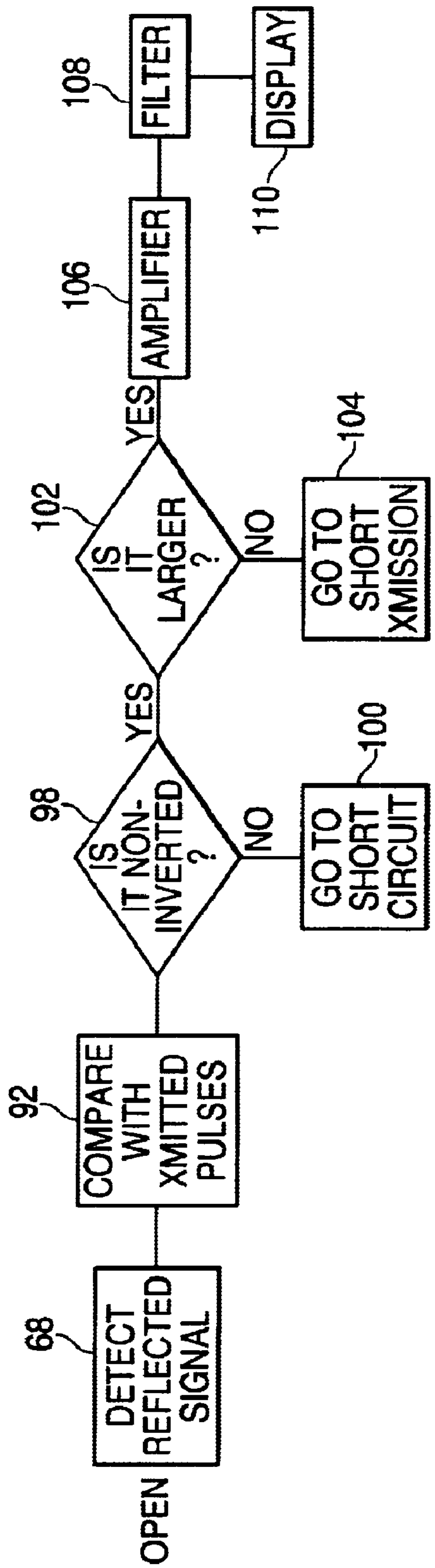
FIG. 6 is a flowchart illustrating steps that may be followed in accordance with one embodiment of the method or process of tracing a open circuited line.

FIG. 6 is a flowchart illustrating steps that may be followed in accordance with one embodiment of the method or process of tracing a open circuited line. This figure further breaks down the step 68 of detecting a reflection of a signal in line 32 that contains an open circuit. The reflected signal is detected and through the step of comparing 92 is analyzed and compared with the signal 28 that was originally transmitted by the signal generator 14. Through the step 92 of determining inversion, the reflected is analyzed to ascertain whether the reflected signal is non-inverted. If it is inverted, then the device proceeds to the short circuit 100.

If the reflected signal is non-inverted, then through the step 102 of analyzing, the reflected signal is analyzed to determine if the signal is larger or higher. If the answer to this comparison is no, then the device restarts 104 the transmission of the signal generator 14 until a better reflected signal is obtained. The transmission of the signal 28 generated by the signal generator 14 stops temporarily or permanently until the step 102 of analyzing is completed. If the reflected signal is higher than the transmitted signal 28, then the signal is amplified 106, filtered 08 and displayed 110 with the output device 24 in terms of feet or miles.

Figure 7:
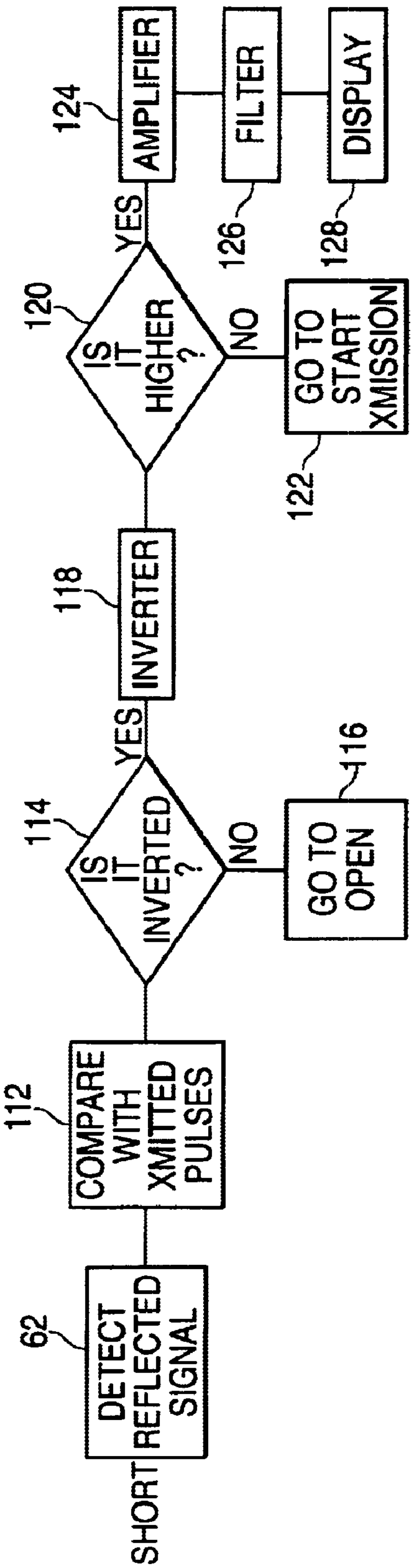
FIG. 7 is a flowchart illustrating steps that may be followed in accordance with one embodiment of the method or process of tracing a terminated line short circuited line.

FIG. 7 is a flowchart illustrating steps that may be followed in accordance with one embodiment of the method or process of tracing a short circuited line. The figure further breaks down the step 62 of detecting a reflection of a signal in line 32 that contains an open circuit in FIG. 4. Through the step of comparing 112, the reflected signal received by the directional coupler 26 is compared with transmitted signal 28. In the step 114 of determining inversion, the micro-controller 12 determines whether the reflected signal is inverted as compared to the transmitted signal 28. If it is not inverted, then the device switches to an open circuit analysis 116.

If the reflected signal is inverted, the reflected signal is inverted with the inverter 118. In the preferred embodiment, a unity inverted amplifier is used to invert the signal to a positive signal such that a comparison can be done between the reflected and transmitted signal.

Through the step 120 of analyzing value, the reflected signal is analyzed to determine if it is higher than the transmitted signal. If it is not, then the device restarts 104 the transmission of the signal generator 14 until a better reflected signal is obtained. This ensures a plus or minus five percent error margin. If the reflected signal is higher than the transmitted signal 28, then the signal is amplified 124, filtered 126 and displayed 128 with the output device 24 in terms of feet or miles. If the line is a terminated line, the transmission of the signal 28 continues. The matching the impedance process, as detailed in FIG. 5, is established to minimize and signal loss.

Figure 8:
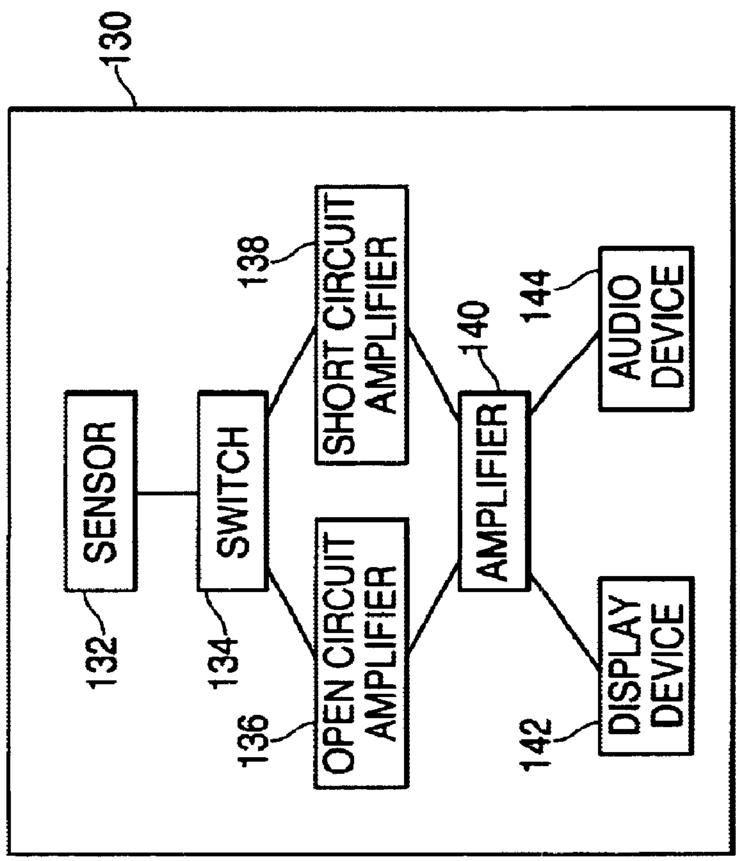
FIG. 8 is block diagram of an alternate embodiment of the detached receiver used to tracer the condition of a traced line.

FIG. 8 is block diagram of an alternate embodiment of the receiver used to tracer the condition of a traced line. This alternate embodiment of the receiver is used apart from the transmission source. However, the transmission source or signal generator 14 provides the signal necessary to use this alternate embodiment. This receiver is used to track the location of a fault that is present in the line being traced. Therefore, the field technician is able to activate the transmission source set it aside and use the alternate embodiment of the receiver to begin to search the embedded structure for the actual location of the problem line. The receiver is able to detect a reflected signal up to thirteen feet away. Furthermore, receiver is not position sensitive, which enables the field technician to place the receiver in any position and detect the reflected signal.

Figure 9:
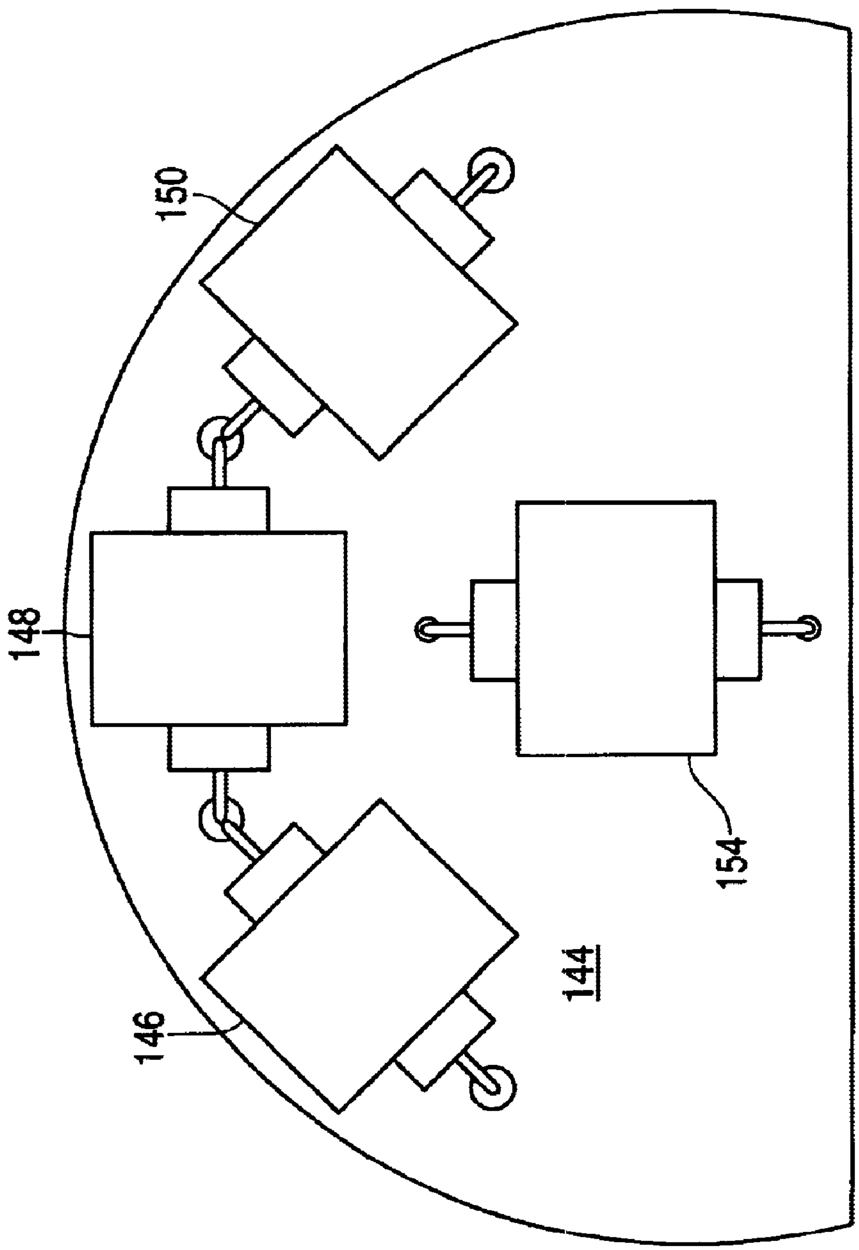
FIG. 9 is an illustration of an arrangement of the sensor used in the alternate embodiment of the receiver in FIG. 8.

This alternate embodiment of the receiver 130 includes a sensor 132, which is an electromagnetic coil sensor with an electrostatic plate. A plurality of sensors 132 are arranged in such a manner that the receiver can be placed in any position without limiting its detection ability. The sensor used in the alternated embodiment is manufactured and sold by J. W. Miller Magnetics of Gardena, Calif. under product number 70F753AI. FIG. 9 displays the positioning of the sensor that achieves the function of being able to detect a signal regardless of its location.

The sensor 132 is connected to an amplifier 134, which transmits the signal 28 to a filter 136. The sensor 132 is a band-pass filter that detects the signal 28 transmitted by the signal generator 14. In this embodiment, the filter detects a thirty-two kilo-hertz carrier signal with a one kilo-hertz and eight hertz signal modulated onto the carrier signal. From the sensor, the signal is passed through either one of the programmable amplifiers 134, 136. The path of the signal to either of the programmable amplifiers 134, 136 is dependent upon the type of line being traced. The type of line being traced is enabled through a switch 138. The switch 138 enables the user to select either and open circuit or short circuit. By depressing the switch 138, an LED 140 either activates showing a short or open circuit.

If the short circuit is selected with the switch 140, the first programmable 134 is selected. In this instance, the signal 28 is passed through the filter 134 to either amplify the signal 28 and/or prevent it from saturating the circuit.

If the open circuit is selected with the switch 140, the second programmable 136 is selected. In this instance, the second programmable filter 136 contains a booster to further strengthen the signal. This is due in part because of the strength of signal being detected. In an open circuit, an electrostatic field is present due in most part because of the lack of an energized line. In a short circuit wire, the line is energized and a magnetic field propagates from the energized line. The signal or field propagated by the short circuit is usually of a greater strength as opposed to the open circuit line. As a result, the open circuit line requires a booster incorporated into the filter to further amplify the circuit. The booster enables the signal to be amplified to a level that a allows the signal to be analyzed, which in turn provides a greater of accuracy and small margin of error.

If this point, the signal 28 is passed through a filter 138 to minimize the margin of error of the detected signal. For example, due to the imperfection of the sensor 132, the signal 28 being detected might begin the twenty-nine or thirty kilo hertz range. The filter 138 is added to the circuit to ensure that the appropriate signal is allowed to be analyzed.

Once the signal is determined to be of a sufficient quality, the detection of the signal 28 is passed onto an output device 140. In this alternate embodiment of the receiver 130, the output device is both an audio device 142 and a visual device 144.

The audio device 142 is an audible sound that indicates the detection of the signal. The sound proceeds to get louder as the receiver 130 gets closer and closer to the signal.

The visual device 144 is an light emitting diode (LED) device that indicates the strength of the signal. These are other display devices that can be used as well. Alternate embodiments of the visual display device are a sensitivity indicator, the type of line detected, e.g., short-circuit, open-wire or a transmitted line, voltage and the determination of whether the traced line is energized or not.

FIG. 9 is an illustration of an arrangement of the sensor used in the alternate embodiment of the receiver in FIG. 8. The sensors 146, 148, 150 are placed to form an arc 152. However, these sensors alone do not allow the receiver to detect the signal 28 or its reflection regardless of the position of the receiver 130. To accomplish this task, a further sensor 154 is placed approximately perpendicularly to the center point of the arc 156. With the addition and location of this sensor 154, the field technician does not need to continually alter the position of the receiver 130 in order for a signal to be detected. Previously models of a wire detector tracer receiver dictated that the field technician alter the position of the receiver such that the receiver can detect a signal in a three-hundred degree circumference. The present invention eliminates this problem and ensure that the receiver 130 can detect all signals around a three-hundred degree circumference.

Figure 10:
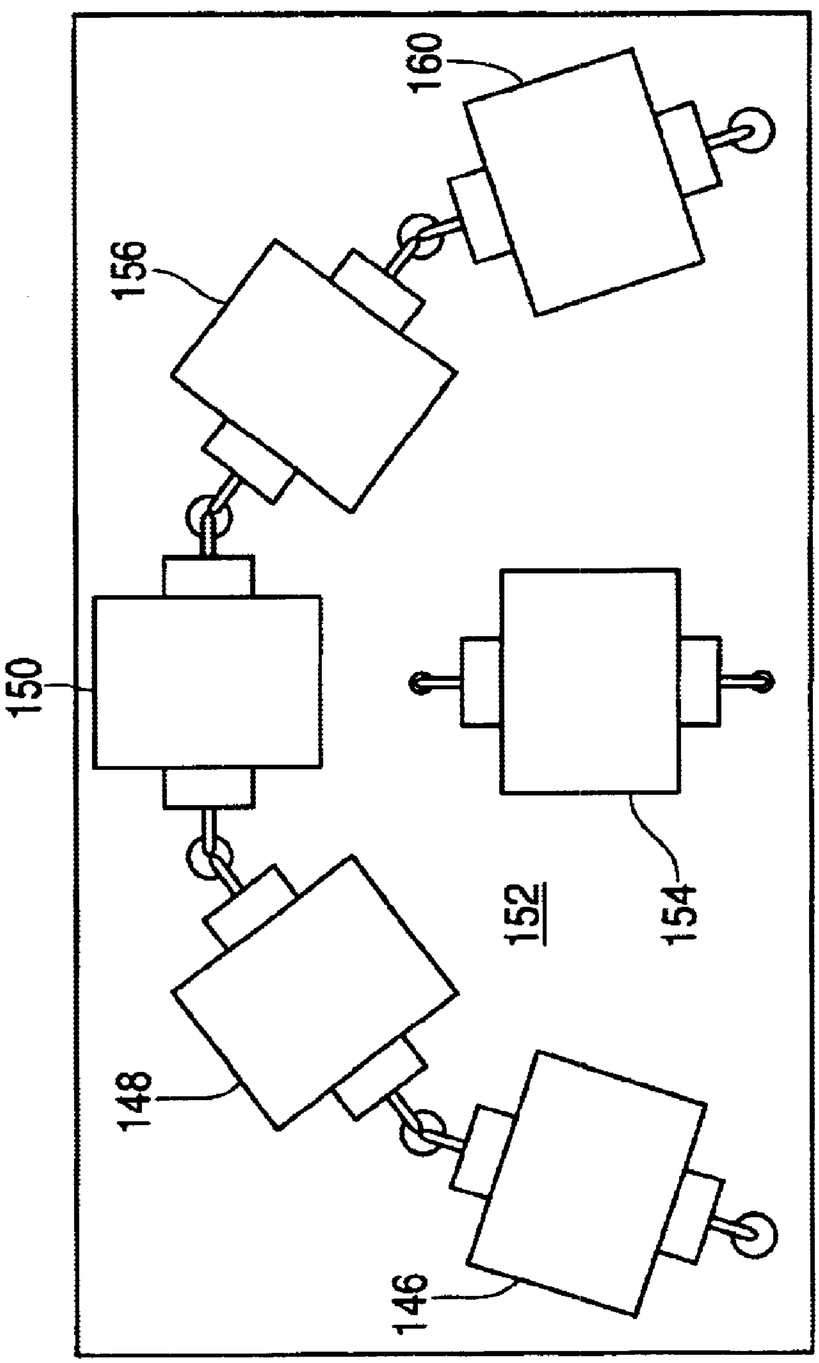
FIG. 10 is further illustration of an alternate arrangement of the sensor used in the alternate embodiment of the receiver in FIG. 8.

FIG. 10 is further illustration of an alternate arrangement of the sensor used in the alternate embodiment of the receiver in FIG. 8. In this embodiment, the number of sensor is increased by two sensors 158, 160. Thus embodiment still maintains the one sensor 154 that is placed approximately perpendicularly to the center line of the arc created by the five sensors 146, 148, 150, 158, 160. These sensors 146, 148, 150, 158, 160 like those that are arranged in FIG. 9 permit the field technician to detect a signal from the line 32 being traced without the need to change the location.

The difference between the sensor arrangement in FIG. 9 and FIG. 10 is a matter of two additional sensors 158, 160. The preferred embodiment for the receiver 130 is the arrangement of the three sensors 146, 148, 150 because it can achieve the same result as the arrangement in FIG. 10. The reduction in components is realized in a cost saving to the manufacturer.

The alternate receiver embodiments allow the signal to be detected regardless of the positioning of the receiver 130. In these embodiments, a reflected signal can be detected from the traced line from as far away as twenty feet. The optimum range is thirteen feet. The receiver itself can detect a transmitted signal as far away as one mile. Distances substantially beyond this point degrade the signal, which would require the need of a booster The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. An apparatus for tracing a line, comprising:

a directional coupler;

a signal generator connected to the directional coupler, the signal generator produces a signal that is transmitted along the line by the directional coupler;

a micro-controller linked to the directional coupler and the signal generator, the micro-controller determines whether the line is energized, the impedance of the line and the condition of the line;

a ground fault circuit linked to the micro-controller;

wherein if the micro-controller determines that the line is energized, the ground fault circuit is activated; and an output linked to the micro-controller.

2. The apparatus as in claim 1, wherein the condition of the line is determined by a reflected signal captured by the direction coupler.

3. The apparatus as in claim 1, further comprising a power supply linked to the micro-controller.

4. The apparatus as in claim 1, wherein the voltage of the line is determined.

5. The apparatus as in claim 4, wherein the voltage determined is in the range of 9 volts to 600 volts.

6. The apparatus as in claim 1, wherein the micro-controller creates an impedance mismatch in order to create a reflected signal.

7. The apparatus as in claim 2, wherein the condition of the line is determined by the micro-controller analyzing the reflected signal captured by the directional coupler.

8. The apparatus as in claim 7, wherein the condition of the line is determined to be an open wire.

9. The apparatus as in claim 7, wherein the condition of the line is determined by determining the voltage wave standing ratio.

10. The apparatus as in claim 7, wherein the condition of the line is determined to be a shorted wire.

11. The apparatus as in claim 9, wherein the reflected signal is inverted.

12. The apparatus as in claim 9, wherein the condition of the line is determined to be a terminated line.

13. A method for tracing a line, comprising:

determining if the line is energized;

if the line is energized, activating a ground fault circuit;

creating an impedance mismatch in the line;

transmitting a signal through the line;

if there is a reflected signal, capturing the reflected signal;

analyzing the reflected signal; and determining the condition of the line.

14. The method as in claim 13, wherein a short wire condition is determined by the reflected signal that is an inversion of the signal.

15. The method as in claim 13, wherein an open wire condition is determined by the reflected signal is that is not an inversion of the signal.

16. The method as in claim 13, further comprising determining the voltage of the line.

17. The method as in claim 16, wherein the voltage detected is in the range of 9 volts to 600 volts.

18. The method as in claim 16, wherein the impedance mismatch is created by creating the reflected signal.

19. The method as in claim 18, wherein the impedance is adjusted by analyzing the strength of the signal.

20. The method as in claim 13, wherein the condition of the line is determined by determining the voltage wave standing ratio.

21. The method of claim 13, further comprising comparing the signal to the reflected signal.

22. The method of claim 21, continuously transmitting a signal until the comparison is within a specified range.

23. The method of claim 22, wherein the range is an error range of plus or minus five percent.

24. The method of claim 21, further comprising amplifying and filtering the reflected signal prior to comparing.

25. An apparatus for tracing a line, comprising:

means for determining if the line is energized;

means for electrically grounding the apparatus in response to an energized line;

means for creating an impedance mismatch in the line;

means for transmitting a signal through the line;

means for capturing the reflected signal;

means for analyzing the reflected signal; and means for determining the condition of the line based upon the reflected signal.

26. The apparatus as in claim 25, wherein the condition of the line is determined by determining the voltage wave standing ratio.

27. The apparatus as in claim 25, wherein a short wire condition is determined by the reflected signal that is an inversion of the signal.

28. The apparatus as in claim 25, further comprising means for determining the voltage of the line.

29. The apparatus as in claim 28, wherein the voltage detected is in the range of 9 volts to 600 volts.

30. The apparatus as in claim 28, wherein the impedance mismatch is created by creating the reflected signal.

31. The apparatus as in claim 30, wherein the impedance is adjusted by analyzing the strength of the signal.

32. The apparatus as in claim 25, wherein an open wire condition is determined by the reflected signal is that is not an inversion of the signal.

33. The apparatus of claim 25, further comprising means for comparing the signal to the reflected signal.

34. The apparatus of claim 33, continuously transmitting a signal until the comparison is within a specified range.

35. The apparatus of claim 34, wherein the range is an error range of plus or minus five percent.

36. The apparatus of claim 33, further comprising means for amplifying and filtering the reflected signal prior to comparing.

* * * * *